US008002444B2

(12) United States Patent
Wu et al.

(10) Patent No.: US 8,002,444 B2
(45) Date of Patent: Aug. 23, 2011

(54) NUMERICAL DISPLAY ARCHITECTURE

(75) Inventors: Chao-Ming Wu, Yilan (TW); Hung-Wen Chen, Taipei County (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 315 days.

(21) Appl. No.: 12/348,901

(22) Filed: Jan. 5, 2009

(65) Prior Publication Data

US 2010/0067238 A1 Mar. 18, 2010

(30) Foreign Application Priority Data

Sep. 18, 2008 (CN) .......................... 2008 1 0198692

(51) Int. Cl.
*F21V 7/00* (2006.01)
*H05K 1/00* (2006.01)

(52) U.S. Cl. ..................... 362/296.01; 362/85; 362/631; 362/646; 362/364; 362/365; 361/748

(58) Field of Classification Search .................... 362/85, 362/631, 646, 364, 365, 296.01; 361/748, 361/760
See application file for complete search history.

(56) References Cited

U.S. PATENT DOCUMENTS 5,081,568 A * 1/1992 Dong et al. ................... 362/184
5,697,175 A * 12/1997 Schwartz ........................ 40/552
5,818,698 A * 10/1998 Corisis .......................... 361/760

* cited by examiner

*Primary Examiner* — Stephen F Husar
*Assistant Examiner* — James W Cranson
(74) *Attorney, Agent, or Firm* — Kile Goekjian Reed & McManus PLLC

(57) ABSTRACT

A numerical display architecture includes a circuit board substrate, a light emitting element, and a reflector. The circuit board substrate includes a first surface and a second surface opposite to the first surface, and has at least one hole. The light emitting element is reversely mounted on the second surface, and a luminary source of the light emitting element is disposed in the hole through a first opening of the hole. The reflector is disposed on the first surface of the circuit board surface and partly or fully covers a second opening of the hole.

11 Claims, 5 Drawing Sheets

(1A)

(1B)

(4A)

(4B)

(5A)

(5B)

NUMERICAL DISPLAY ARCHITECTURE

BACKGROUND OF THE INVENTION

1. Field of the Invention

The present disclosure relates to a numerical display architecture, and more particularly, to a numerical display architecture using a reverse mount to improve its architecture and its combination manner and thereby save space.

2. Description of the Prior Art

Numerical display elements have been widely applied to miscellaneous electronic products, such as home appliances, home audios, cameras, and instrument equipments, wherein the numerical display elements use a light emitting diode (LED) or an electro-optical substance to display letters or figures.

Please refer to FIG. 1. FIG. 1 (including 1A and 1B) is a diagram showing a conventional numerical display architecture 140 and its combination manner according to the prior art. As shown in 1A, the conventional numerical display architecture 140 is formed by disposing a plurality of LEDs 120 on a first surface 112 of the circuit board substrate 110. Because the LEDs 120 are obversely fixed on the first surface 112 of the circuit board substrate 110, a reflector 130 installed on the first surface 112 of the circuit board 110 usually has a definite thickness. Recently, a thickness h1 of the reflector of the common numerical display architecture in the market conditions is approximately 3~3.5 mm. When the conventional numerical display architecture 140 is directly fabricated/mounted on a front side 152 of a motherboard 150 of an electronic product by using an obverse surface mount manner, a problem that the conventional numerical display architecture 140 sticks out the front side 152 of the motherboard 150 often occurs. Another solution is to open a hole 185 on a motherboard 180 and reversely fabricate the conventional numerical display architecture 140 on a back side 184 of the motherboard 180 so as to put the reflector 130 of the conventional numerical display architecture 140 in the hole 185 (as is shown in 1B). However, because the reflector 130 of the conventional numerical display architecture 140 has a definite thickness, a problem that the conventional numerical display architecture 140 sticks out a front side 182 of the motherboard 180 still occurs.

As can be known from the descriptions above, fabrications, such as the numerical display architecture, affect the fabricating space of the electronic product very much. In addition, due to most of the electronic products in the market conditions having a trend of minimization in architecture design, hence how to reduce the size of the numerical display architecture and how to reduce cost have become an important topic of this design field.

SUMMARY OF THE INVENTION

It is one of the objectives of the present disclosure to provide a numerical display architecture to solve the above-mentioned problems.

The present disclosure provides a numerical display architecture. The numerical display architecture includes a circuit board substrate, a light emitting element, and a reflector. The circuit board substrate includes a first surface and a second surface opposite to the first surface, and has at least one hole. The light emitting element is reversely mounted on the second surface, and a luminary source of the light emitting element is disposed in the hole through a first opening of the hole. The reflector is disposed on the first surface of the circuit board surface and partly or fully covers a second opening of the hole.

The present disclosure provides a numerical display architecture. The numerical display architecture includes a circuit board substrate, a light emitting element, and a reflector. The circuit board substrate has a trough containing space. The light emitting element is mounted on the circuit board substrate reversely or obversely. The reflector is disposed on the trough containing space of the circuit board substrate. The circuit board substrate includes engineering plastics and is an injection-molding device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms “include”, “including”, “comprise”, and “comprising” are used in an open-ended fashion, and thus should be interpreted to mean “including, but not limited to . . . ”. The terms “couple” and “coupled” are intended to mean either an indirect or a direct electrical connection. Thus, if a first device couples to a second device, that connection may be through a direct electrical connection, or through an indirect electrical connection via other devices and connections.

Figure 2:
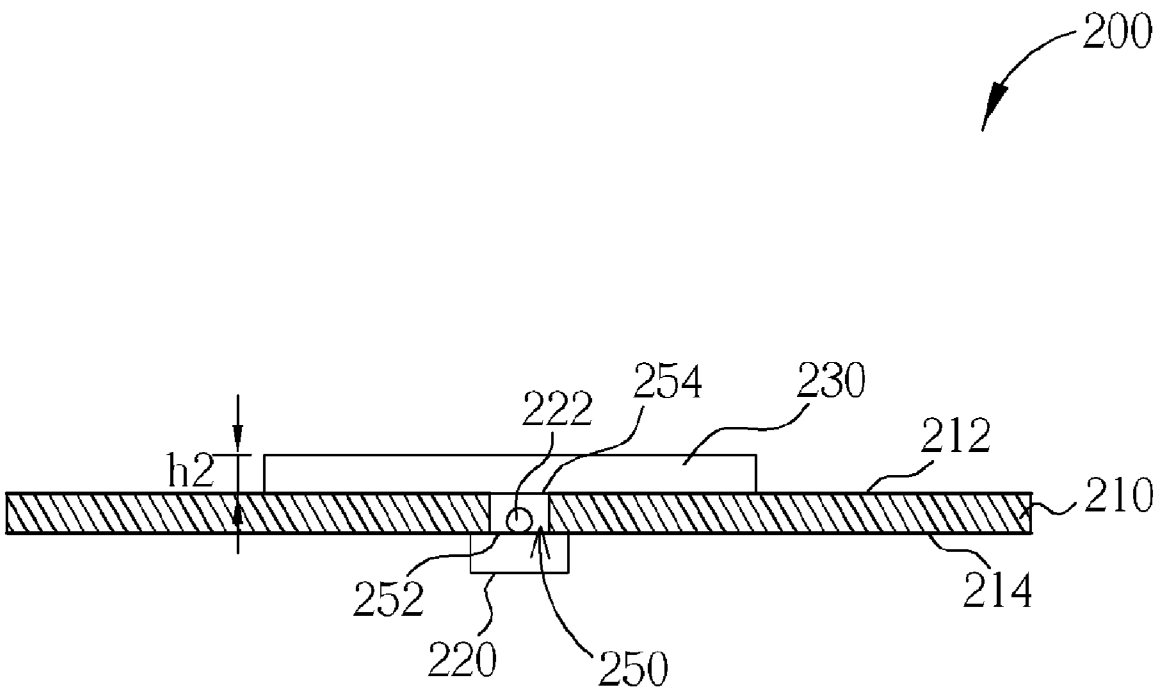
FIG. 2 is a diagram of a numerical display architecture according to a first embodiment of the present disclosure.

Please refer to FIG. 2. FIG. 2 is a diagram of a numerical display architecture 200 according to a first embodiment of the present disclosure. As shown in FIG. 2, the numerical display architecture 200 includes (but is not limited to) a circuit board substrate 210, at least one light emitting element 220, and a reflector 230. The circuit board substrate 210 has a first surface 212 and a second surface 214 opposite to the first surface 212, and the circuit board substrate 210 includes at least one hole 250. In this embodiment, the first surface 212 acts as the front side of the numerical display architecture 200 and the second surface 214 acts as the back side of the numerical display architecture 200. The light emitting element 220 is reversely mounted on the second surface 214 of the circuit board substrate 210, wherein a luminary source 222 of the light emitting element 220 is disposed in the hole 250 through a first opening 252 of the hole 250. The reflector 230 is disposed on the first surface 212 of the circuit board surface 210, wherein a second opening 254 of the hole 250 is partly or fully covered by the reflector 230.

Figure 1:
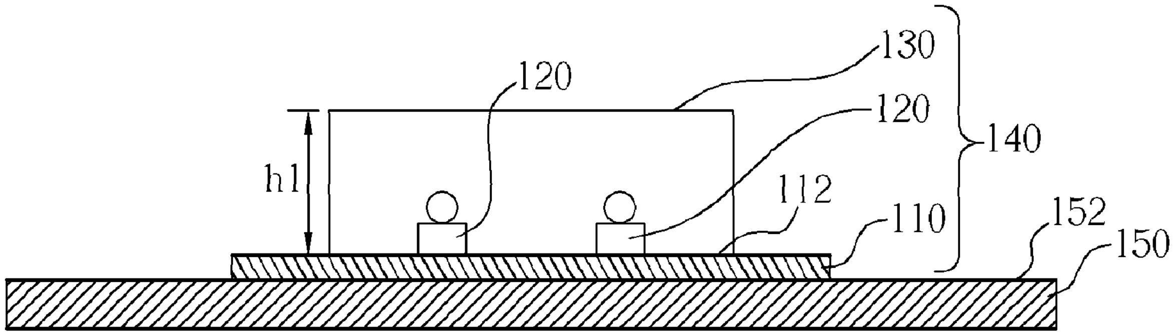
FIG. 1 PRIOR ART
FIG. 1 (including 1A and 1B) is a diagram showing a conventional numerical display architecture and its combination manner according to the prior art.
Figure 1:
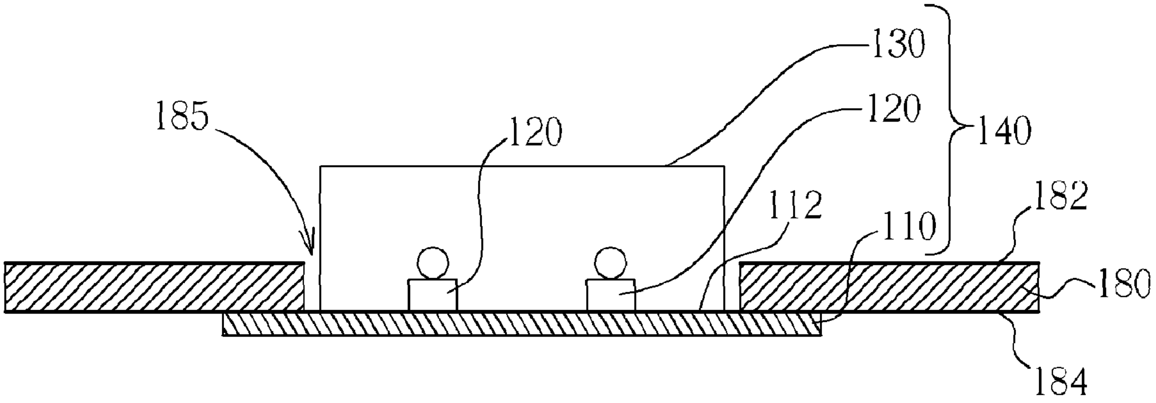
FIG. 1 PRIOR ART

Please note that the above-mentioned light emitting element 220 can be a surface mount device (SMD), such as a LED or an electro-optical substance. But this should not be considered as a limitation of the present disclosure, and another type of light emitting elements can be adopted. Due to the light emitting element 220 being reversely mounted on the second surface 214 of the circuit board substrate 210, a thickness h2 of the reflector 230 can be substantially reduced. In this embodiment, the thickness h2 of the reflector 230 is substantially 1.5~2 mm. As can be known by comparing the thickness h2 of the reflector 230 disclosed in the present disclosure with the thickness h1 of the reflector 130 of the conventional numerical display architecture 140 shown in FIG. 1, the thickness h2 of the reflector 230 disclosed in the present disclosure is improved quite a lot.

Figure 3:
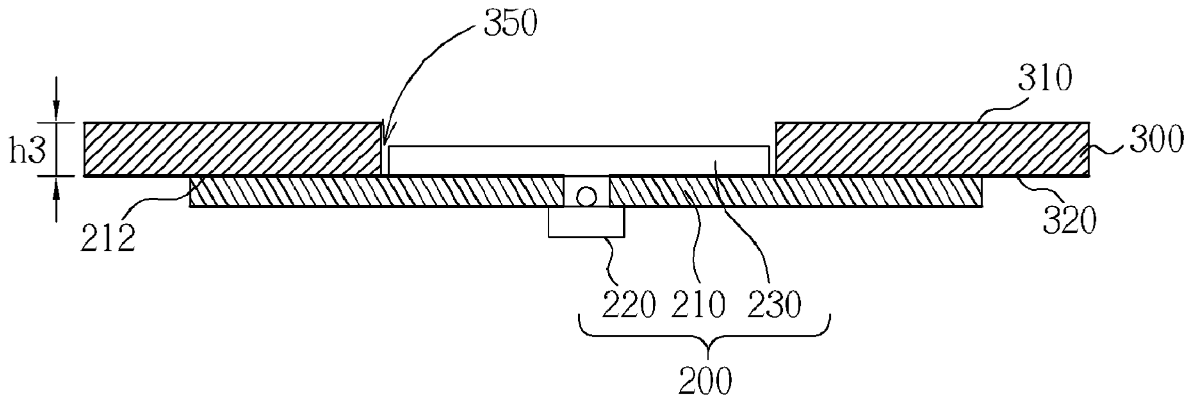
FIG. 3 is a diagram illustrating how to fabricate the numerical display architecture shown in FIG. 2 on a motherboard according to an embodiment of the present disclosure.

FIG. 3 is a diagram illustrating how to fabricate the numerical display architecture 200 shown in FIG. 2 on a motherboard 300 according to an embodiment of the present disclosure. The motherboard 300 has a third surface 310 and a fourth surface 320 opposite to the third surface 310, and the motherboard further includes a second hole 350. In this embodiment, the third surface 310 acts as the front side of the motherboard 300 and the fourth surface 320 acts as the back side of the motherboard 300. When the numerical display architecture 200 is combined with the motherboard 300, the first surface 212 of the circuit board substrate 210 is fixed on the fourth surface 320 of the motherboard 300 and the reflector 230 is located in the second hole 350. In other words, the numerical display architecture 200 is reversely mounted on the back side (i.e., the fourth surface 320) of the motherboard 300 to locate the reflector 230 in the second hole 350. As can be known from FIG. 3, the thickness h2 of the reflector 230 can be designed to be smaller than or equal to a thickness h3 of the motherboard due to the thickness h2 of the reflector 230 of the numerical display architecture 200 having been substantially reduced. Therefore, a problem that the numerical display architecture 200 sticks out the front side (i.e., the third surface 310) of the motherboard 150 can be avoided to achieve goals of saving space and reducing size.

Figure 4:
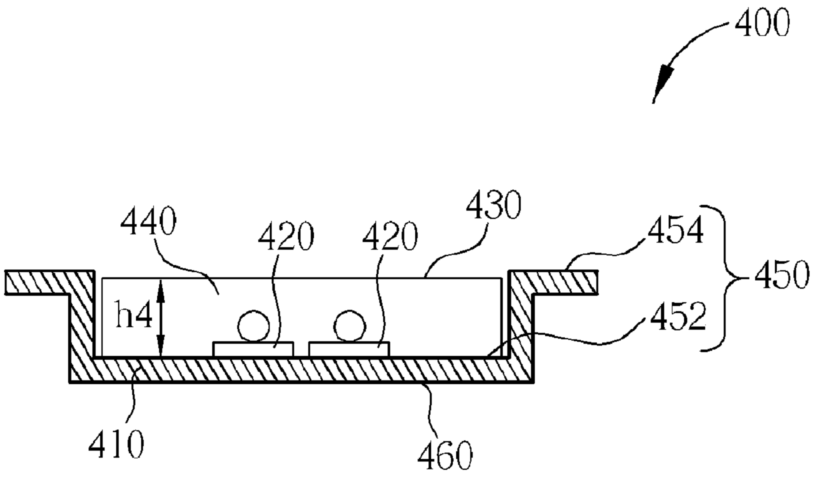
FIG. 4 (including 4A and 4B) is a diagram of a numerical display architecture according to a second embodiment of the present disclosure.
Figure 4:
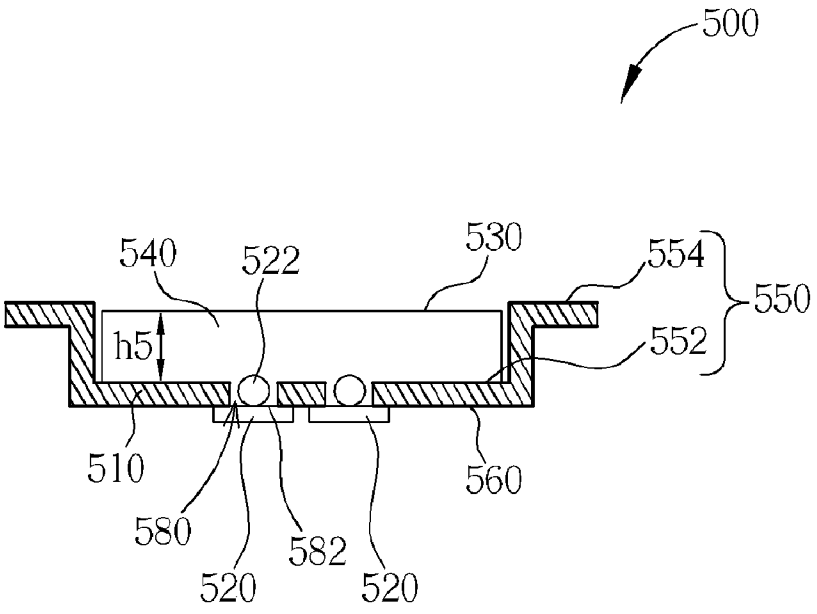

Please note that again, these embodiments above are presented merely for describing applications of the present disclosure, and in no way should be considered to be limitations of the scope of the present disclosure. Please refer to FIG. 4. FIG. 4 (including 4A and 4B) is a diagram of a numerical display architecture according to a second embodiment of the present disclosure. As shown in 4A, a numerical display architecture 400 includes (but is not limited to) a circuit board substrate 410, at least one light emitting element 420, and a reflector 430. The circuit board substrate 410 has a trough containing space 440. The light emitting element 420 is mounted on the circuit board substrate 410, and the reflector 430 is disposed on the trough containing space 440 of the circuit board substrate 410. In this embodiment, the circuit board substrate 410 has a first surface 450 and a second surface 460 opposite to the first surface 450. Be noted that the first surface 450 in this embodiment is not a flat plane. The first surface 450 includes a first surface area 452 and a second surface area 454, wherein the first surface area 452 acts as a bottom of the trough containing space 440 and the light emitting element 420 is obversely mounted on the first surface area 452.

As shown in 4B, the numerical display architecture 500 includes a circuit board substrate 510, at least one light emitting element 520, and a reflector 530. In this embodiment, the circuit board substrate 510 has a tough containing space 540, and the circuit board substrate 510 includes a first surface 550 and a second surface 560 opposite to the first surface 550. A first surface area 552 of the first surface 550 acts as a bottom of the trough containing space 540. The numerical display architecture 500 shown in 4B is familiar to the numerical display architecture 400 shown in 4A, and the difference between them is that the circuit board substrate 510 of the numerical display architecture 500 has at least one hole 580 and the light emitting element 520 is reversely mounted on the second surface 560 of the circuit board substrate 510 to dispose a luminary source 522 of the light emitting element 520 in the hole 580 through a first opening 582 of the hole 580. Be compared with the numerical display architecture 400, a thickness h5 of the reflector 530 of the numerical display architecture 500 can be designed to be smaller than the thickness h4 of the reflector 430 of the numerical display architecture 400 because the light emitting element 520 is reversely mounted on the back side (i.e., the second surface 560) of the circuit board 510.

In this embodiment, each of the circuit boards 410 and 510 can compose engineering plastics and can be an injection-molding device. In addition, the first surfaces 450 and 550 or the second surfaces 460 and 560 of the circuit boards 410 and 510 can further include a printed circuit (not shown in the figures), wherein the circuit board substrates 410 and 510 are provided with electronic conductivity according to a laser manner and then the printed circuit is printed on the first surfaces 450 and 550 or the second surfaces 460 and 560 of the circuit board substrates 410 and 510 by electroplating. But this should not be considered as limitations of the present disclosure and the circuit board substrates 410 and 510 can choose other materials depending on product demands. Besides, the printed circuit can be printed on the circuit board substrates 410 and 510 by adopting other ways.

Figure 5:
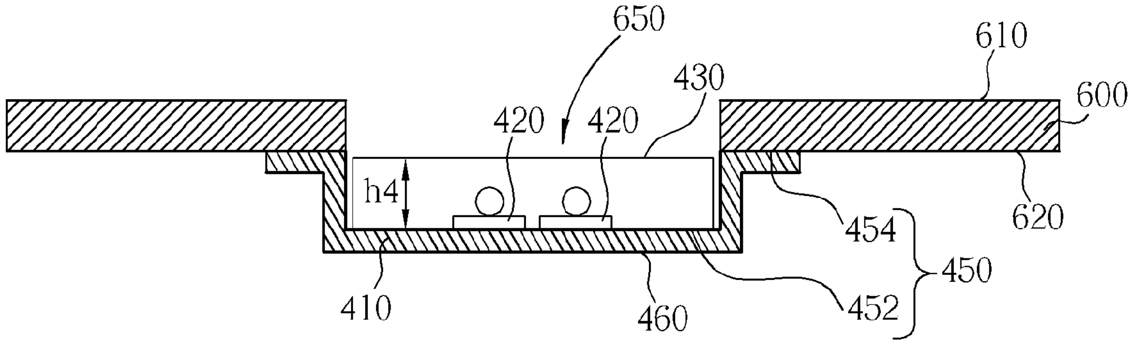
FIG. 5 (including 5A and 5B) is a diagram illustrating how to fabricate the numerical display architecture shown in FIG. 4 on a motherboard according to an embodiment of the present disclosure.
Figure 5:
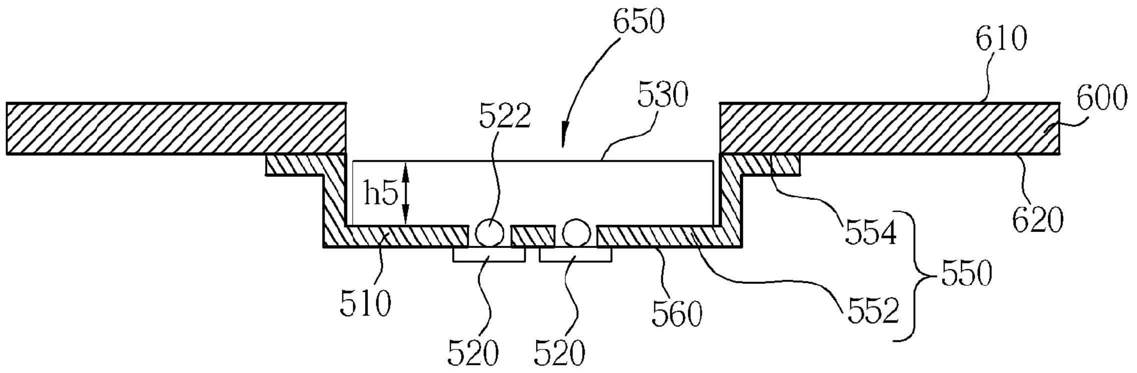

Please refer to FIG. 5. FIG. 5 (including 5A and 5B) is a diagram illustrating how to fabricate the numerical display architectures 400 and 500 shown in FIG. 4 on a motherboard 600 according to an embodiment of the present disclosure. As shown in 5A and 5B, the motherboard 600 has a third surface 610 and a fourth surface 620 opposite to the third surface 610, and the motherboard 600 further includes a second hole 650. The second surface areas 454 and 554 of the first surfaces 450 and 550 of the circuit board substrates 410 and 510 are respectively fixed on the fourth surface 620 of the motherboard 600, and the reflectors 430 and 530 are located in the second hole 650.

As can be seen from FIG. 5, because the numerical display architectures 400 and 500 are reversely mounted on the back side (i.e., the fourth surface 620) of the motherboard 600, the surfaces of the reflectors 430 and 530 are lower than the third surface 610 of the motherboard 600 or both of them are located on the same plane. Therefore, a problem that the numerical display architectures 400 and 500 stick out the front side (i.e., the third surface 610) of the motherboard 600 can be avoided to achieve goals of saving space and reducing size.

Be noted that, in the first embodiment above, although the thickness h2 of the reflector 230 can be designed as small as possible to be smaller than (or equal to) the thickness h3 of the motherboard 300 when fabricating the numerical display architecture 200 on the motherboard 300 (as is shown in FIG. 3), a condition that the thickness h3 of the motherboard 300 is smaller than the thickness h2 of the reflector h2 may happen if the thickness h2 of the reflector 230 must have a definite thickness due to the special restriction of the numerical display architecture 200 itself. Therefore, the problem that the numerical display architecture 200 sticks out the front side of the motherboard 300 still cannot be avoided, although the goal of reducing size can be achieved by this method. In the second embodiment above, the circuit boards 410 and 510 of the numerical display architectures 400 and 500 can completely cover the thicknesses h4 and h5 of the reflectors 430 and 530 due to their special architectures. Thus the surfaces of the reflectors 430 and 530 are lower than the second surface areas 454 and 554 when fabricating the numerical display architectures 400 and 500 on the motherboard 600 (as is shown in 5A and 5B). Therefore, the problem that the numerical display architectures 400 and 500 stick out the front side of the motherboard 600 can be completely solved. In other words, the application range of the numerical display architectures 400 and 500 is more extensive than that of the numerical display architecture 200.

Operations of illustrating how to fabricate the numerical display architecture 200 and how to fabricate it on the motherboard 300 can be implemented by the following steps:

Step 702: Start.

Step 704: Provide a circuit board substrate, a light emitting element, and a reflector, wherein the circuit board substrate has a first surface and a second surface opposite to the first surface.

Step 706: Open a hole on the circuit board substrate.

Step 708: Reversely mount the light emitting element on the second surface to dispose a luminary source of the light emitting element in the hole through a first opening of the hole.

Step 710: Dispose the reflector on the first surface of the circuit board substrate and cover a second opening of the hole to form a numerical display architecture.

Step 712: Provide a motherboard having a third surface and a fourth surface opposite to the third surface.

Step 714: Open a second hole on the motherboard.

Step 716: Mount the first surface of the circuit board substrate on the fourth surface of the motherboard to fix the numerical display architecture on the motherboard, wherein the reflector is located in the second hole.

Operations of illustrating how to fabricate the numerical display architecture 400 and how to fabricate it on the motherboard 600 can be implemented by the following steps:

Step 802: Start.

Step 804: Provide a circuit board substrate, a light emitting element, and a reflector, wherein the circuit board substrate has a first surface and a second surface opposite to the first surface.

Step 806: Form the circuit board substrate by an injection-molding manner to form a tough containing space in the circuit board substrate, wherein a first surface area of a first surface acts as a bottom of the tough containing space.

Step 808: Obversely mount the light emitting element on the first surface area.

Step 810: Dispose the reflector on the tough containing space of the circuit board substrate to form a numerical display architecture.

Step 812: Provide a motherboard having a third surface and a fourth surface opposite to the third surface.

Step 814: Open a second hole on the motherboard.

Step 816: Mount a second surface area of the first surface of the circuit board substrate on the fourth surface of the motherboard to reversely mount the numerical display architecture on the motherboard, wherein the reflector is located in the second hole.

Operations of illustrating how to fabricate the numerical display architecture 500 and how to fabricate it on the motherboard 600 can be implemented by the following steps:

Step 902: Start.

Step 904: Provide a circuit board substrate, a light emitting element, and a reflector, wherein the circuit board substrate has a first surface and a second surface opposite to the first surface.

Step 906: Form the circuit board substrate by an injection-molding manner to form a tough containing space in the circuit board substrate, wherein a first surface area of a first surface acts as a bottom of the tough containing space.

Step 908: Reversely mount the light emitting element on the second surface to dispose a luminary source of the light emitting in an hole through an opening of the hole.

Step 910: Dispose the reflector on the tough containing space of the circuit board substrate to form a numerical display architecture.

Step 912: Provide a motherboard having a third surface and a fourth surface opposite to the third surface.

Step 914: Open a second hole on the motherboard.

Step 916: Mount a second surface area of the first surface of the circuit board substrate on the fourth surface of the motherboard to reversely mount the numerical display architecture on the motherboard, wherein the reflector is located in the second hole.

The above-mentioned embodiments are presented merely for describing the present disclosure, and in no way should be considered to be limitations of the scope of the present disclosure. From the above descriptions, the present disclosure provides a numerical display architecture. By adopting the numerical display architecture disclosed in the present disclosure, not only the thickness of the reflector (for example, h2<h1) can be substantially reduced but also the problem that the numerical display architecture sticks out the front side of the motherboard can be avoided to achieve goals of saving space and reducing size when fabricating the numerical display architecture disclosed in the present disclosure on the motherboard of the electronic product by a reverse mount manner. Furthermore, a tough containing space is formed on the circuit board substrate by an injection-molding manner to construct the numerical display architecture, and then the numerical display architecture (400 or 500) is mounted on the back side of the motherboard by a reverse mount manner. Therefore, not only the size of the numerical display architecture can be reduced but also the cost can be reduced to satisfy the minimization demands for the electronic products in the market conditions.

Those skilled in the art will readily observe that numerous modifications and alterations of the device and method may be made while retaining the teachings of the invention.

What is claimed is:

1. A numerical display architecture comprising:

a circuit board substrate, having a first surface and a second surface opposite to the first surface, the circuit board substrate comprising at least one hole;

a light emitting element, reversely mounted on the second surface, wherein a luminary source of the light emitting element is disposed in the hole through a first opening of the hole;

a reflector, disposed on the first surface of the circuit board surface, wherein a second opening of the hole is at least partially covered by the reflector; and a motherboard, comprising a third surface, a fourth surface opposite to the third surface and a second hole, wherein the first surface of the circuit board substrate is fixed on the fourth surface of the motherboard and the reflector is located in the second hole.

2. The numerical display architecture of claim 1, wherein the light emitting element is a light emitting diode (LED).

3. The numerical display architecture of claim 1, wherein a thickness of the reflector is substantially 1.5.infin 2 mm.

4. A numerical display architecture, comprising:

a circuit board substrate having a trough containing space;

a light emitting element, mounted on the circuit board substrate; and a reflector, disposed on the trough containing space of the circuit board substrate.

5. The numerical display architecture of claim 4, wherein the circuit board substrate comprises a surface having a first surface area acted as a bottom of the trough containing space, and the light emitting element is obversely mounted on the first surface area.

6. The numerical display architecture of claim 4, wherein the circuit board substrate comprises at least one hole and further has a first surface having a first surface area acted as a bottom of the trough containing space and a second surface opposite to the first surface, and the light emitting element is reversely mounted on the second surface and a luminary source of the light emitting element is disposed in the hole through an opening of the hole.

7. The numerical display architecture of claim 4, wherein the light emitting element is a light emitting diode (LED).

8. The numerical display architecture of claim 4, wherein the circuit board substrate comprises engineering plastics.

9. The numerical display architecture of claim 8, wherein the circuit board substrate is an injection-molding device.

10. The numerical display architecture of claim 4, being fixed on a motherboard, wherein the circuit board substrate comprises a first surface having a first surface area acted as a bottom of the trough containing space and a second surface opposite to the first surface, and the motherboard comprises a third surface and a fourth surface opposite to the third surface and comprises a hole, and a second surface area of the first surface is fixed on the fourth surface of the motherboard.

11. The numerical display architecture of claim 10, wherein at least one part of the reflector is located in the hole.

* * * * *